United States Patent [19]

Erickson et al.

[11] Patent Number: 5,640,106
[45] Date of Patent: Jun. 17, 1997

[54] METHOD AND STRUCTURE FOR LOADING DATA INTO SEVERAL IC DEVICES

[75] Inventors: Charles R. Erickson, Fremont; Lawrence Cy-Wei Hung, Los Gatos, both of Calif.

[73] Assignee: Xilinx, Inc., San Jose, Calif.

[21] Appl. No.: 451,781

[22] Filed: May 26, 1995

[51] Int. Cl.⁶ .................................................. H03K 19/177
[52] U.S. Cl. ............................ 326/38; 326/40; 364/716
[58] Field of Search ............................ 326/38, 39, 40; 340/825.83; 364/716

[56] References Cited

U.S. PATENT DOCUMENTS

| | | | |
|---|---|---|---|
| 4,942,319 | 7/1990 | Pickett et al. | 326/38 |
| 4,963,768 | 10/1990 | Arawal et al. | 326/38 |
| 5,394,031 | 2/1995 | Britton et al. | 326/38 |
| 5,394,032 | 2/1995 | Conzelmann et al. | 326/38 |
| 5,493,239 | 2/1996 | Zlotnick | 326/38 |

*Primary Examiner*—Edward P. Westin
*Assistant Examiner*—Benjamin D. Driscoll
*Attorney, Agent, or Firm*—Edel M. Young; Adam H. Tachner

[57] ABSTRACT

An apparatus and method for decreasing the amount of time necessary to load configuration data into Field Programmable Gate Arrays (FPGAs) or other integrated circuit devices. In a preferred embodiment, serially arrayed FPGAs receive a concatenated stream of data from a common data bus. As a first FPGA reaches a loading-complete state, an enabling token is passed from the first FPGA to an enabling input on the next FPGA. The process repeats until all devices are completely loaded or fully configured.

52 Claims, 3 Drawing Sheets

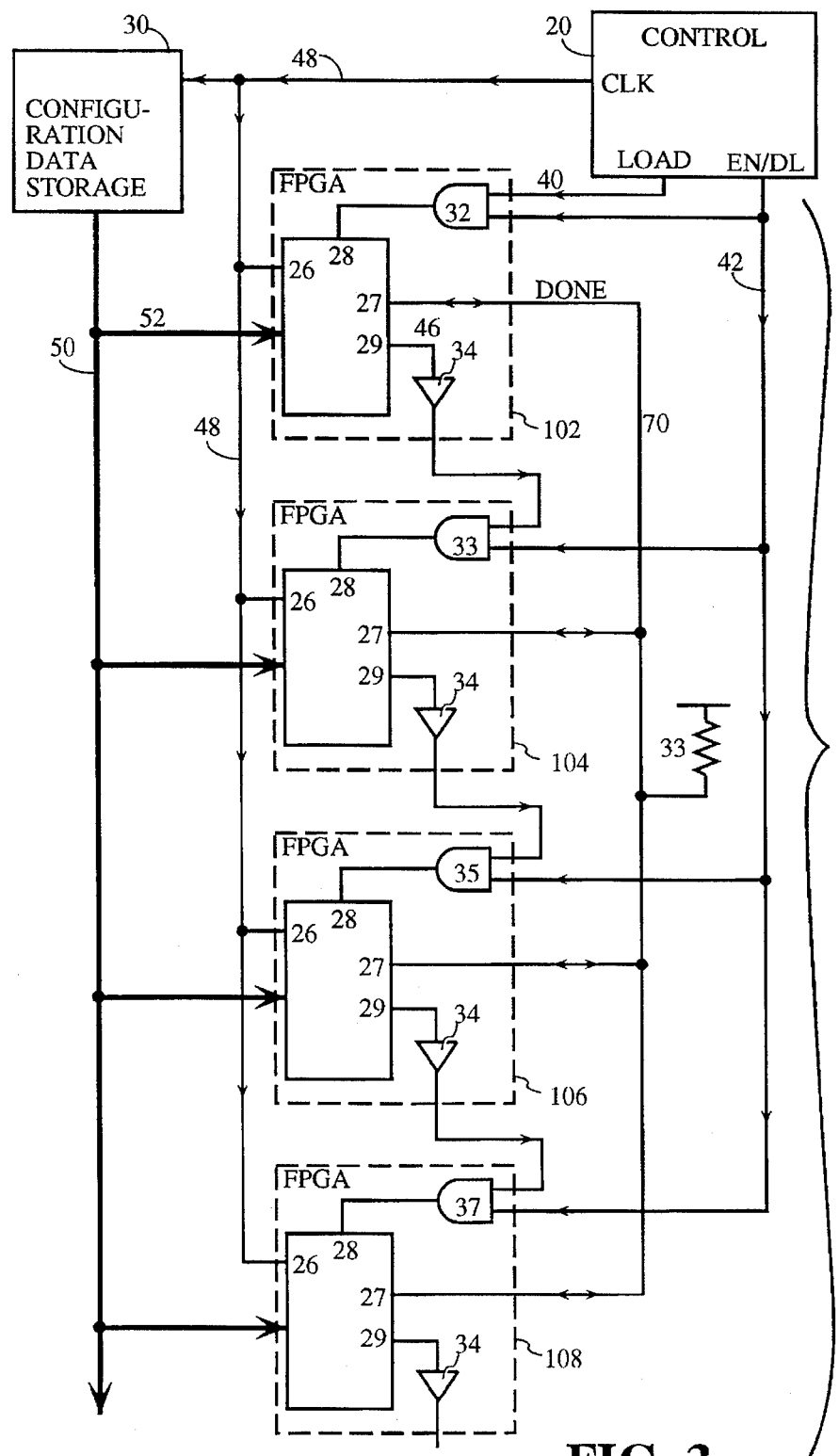
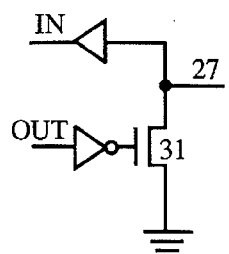
FIG. 4
FIG. 3

METHOD AND STRUCTURE FOR LOADING DATA INTO SEVERAL IC DEVICES

BACKGROUND OF THE INVENTION

1. Field of the Invention

This invention relates generally to loading data into integrated circuit devices. More particularly, this invention relates to enabling and configuring a plurality of field programmable gate arrays.

2. Description of the Related Art

In the electronics industry, field-programmable devices such as Field-Programmable Gate Arrays (FPGAs) have emerged as efficient tools for quick product development and low-cost prototyping. An FPGA consists of an array of uncommitted elements that can be interconnected in a general way. The interconnections between the elements are user-programmable.

FIG. 1 shows a prior art conceptual diagram of a typical FPGA. As depicted, it consists of a two-dimensional array of logic blocks that can be connected by general interconnection resources. The interconnect comprises segments of wire, where the segments may be of various lengths, and switches that serve to connect the logic blocks to the wire segments, or one wire segment to another. Logic circuits are implemented in the FPGA by partitioning the logic into individual logic blocks and then interconnecting the blocks as required via the switches.

The FPGA-assisted design process begins with initial logic entry of the circuit to be implemented. This is normally done using a computer-assisted design tool. The expression of the logic entry is then transformed, or mapped, into a circuit of FPGA logic blocks 6, as illustrated in FIG. 1. Once the logic is mapped into logic blocks, it is necessary to decide where to place each block in the FPGA's array. Once placement is completed, routing between circuit elements is required. Routing software assigns the FPGA's wire segments 14 and chooses programmable switches to establish the required connections among the logic blocks and to configure input/output blocks Upon successful completion of the placement and routing steps, the design system's output is fed to a configuring unit, which configures the final FPGA device with the configuration data. To implement a desired circuit, the FPGA must be given the information as to what connections are to be made and/or what logic is to be implemented. This is generally accomplished by employing a configuration bitstream.

The configuration bitstream is generally used to configure switches inside the FPGA to a desired state, (e.g., on or off). These switches can be implemented from RAM cells which control pass transistors, antifuse connection points, fuse connection points, or any other type of switch implementation. These switches are then used to control the configurable routing or logic on the FPGA. Configuration of the FPGA empowers the user to create any one of myriad possible circuit layouts on a unitary device or a group of devices.

When a design requires more than one FPGA, there are several options for storing configuration data and loading the final configuration data into an FPGA device. For example, in one known method of loading configuration data into a plurality of FPGAs, multiple devices are serially connected with data transfer lines and configured through a data bus connected only to the first device in the chain. When the first device has configured, additional data is directed through the first device and into the second device, where the procedure repeats until all devices are fully loaded.

While this technique is commonly used, at least two flaws are readily apparent. First, serial flow of data is rather slow when compared to parallel data flow. Second, the process is further prolonged by the need to run data through all preceding devices before the data reaches its intended device destination. Slow data flow also ties up the data bus, a crucial thoroughfare which could be used for other data processing functions, such as I/O or addressing, instead of waiting for the cascading flow of configuration data to conclude.

As the size or gate count of FPGAs increases, the number of switches in an FPGA will increase appreciably. As a consequence, the configuration bitstream becomes larger, making the bitstream difficult to manage and move through a transfer line quickly. The amount of time required to configure the FPGA becomes more burdensome during device testing where it is common to reconfigure the FPGA many times. Therefore, the industry requires a method and structure to reduce the time required to configure FPGAs, especially in systems having multiple FPGAs.

One possible method for accelerating the flow of data is the use of parallel data flow instead of serial flow. While one could send parallel data from the data bus to the devices, the data transfer line device interconnect would require the dedication of a large number of I/O device pins to the configuration function. Moreover, these dedicated I/O pins would be further constrained to chip-to-chip data transfer.

Alternatively, one could avoid the cascading data approach entirely by sending the data stream to only one device at a time directly from the data bus. However, this technique would require an additional decode means or other means, possibly external to the FPGA devices for independently controlling each device.

There is, therefore, a need for a system and method for loading data into a plurality of integrated circuit devices which allows for independent access to each device from a common data source, but which does not depend on control means external to the devices to ensure data reaches an intended device.

SUMMARY OF THE INVENTION

The present invention provides a method and structure for loading data into a plurality of integrated circuit devices. The devices are tied together as a series array with each device connected to a common data bus. After a first device is enabled and filled with data, a second device receives an enabling signal from the first device. The process continues until all serially connected devices are full or, in the case of FPGAs, are fully configured.

It is therefore a first object of the present invention to provide a method and structure for loading data into a plurality of integrated circuit devices and for enabling each of the devices without the use of circuitry external to the plurality of devices.

A further object of the present invention is to provide a circuit for loading a concatenated stream of data to a plurality of integrated circuit devices, wherein the data reaches each device in parallel format.

Still another object of the present invention is to provide a circuit and method for loading data into a plurality of integrated circuit devices wherein the time required for suspension and resumption of configuration of any particular device is independent of the number of devices in the plurality.

Yet another object of the present invention is to provide a circuit and method for loading configuration data into a plurality of serially arrayed programmable logic devices, wherein the data is loaded directly from a common data bus into each device and the devices receive an enabling token, passed from one device to the next as each device reaches a fully configured state.

Further features and advantages of the present invention, as well as the structure and operation of various embodiments of the present invention, are described in detail below with reference to the accompanying drawings.

BRIEF DESCRIPTION OF THE DRAWINGS

FIG. 3 is a block diagram of a preferred embodiment of the present invention.

FIG. 4 is a diagram of a circuit internal to the FPGA logic which provides a wired AND function on bus 70.

DETAILED DESCRIPTION OF THE PREFERRED EMBODIMENTS

Figure 1:
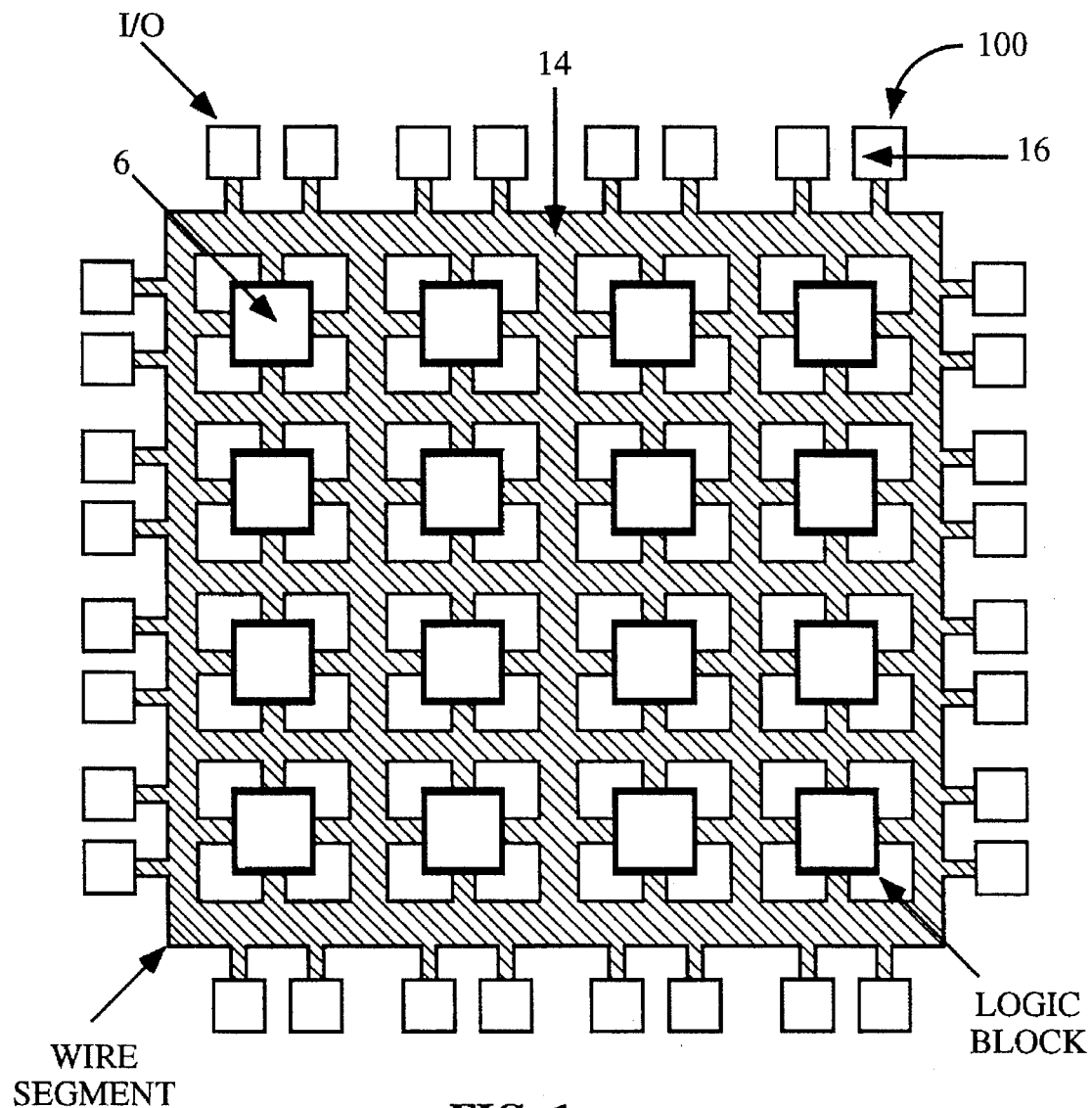
FIG. 1 is a prior art conceptual representation of a field-programmable gate array.
Figure 2:
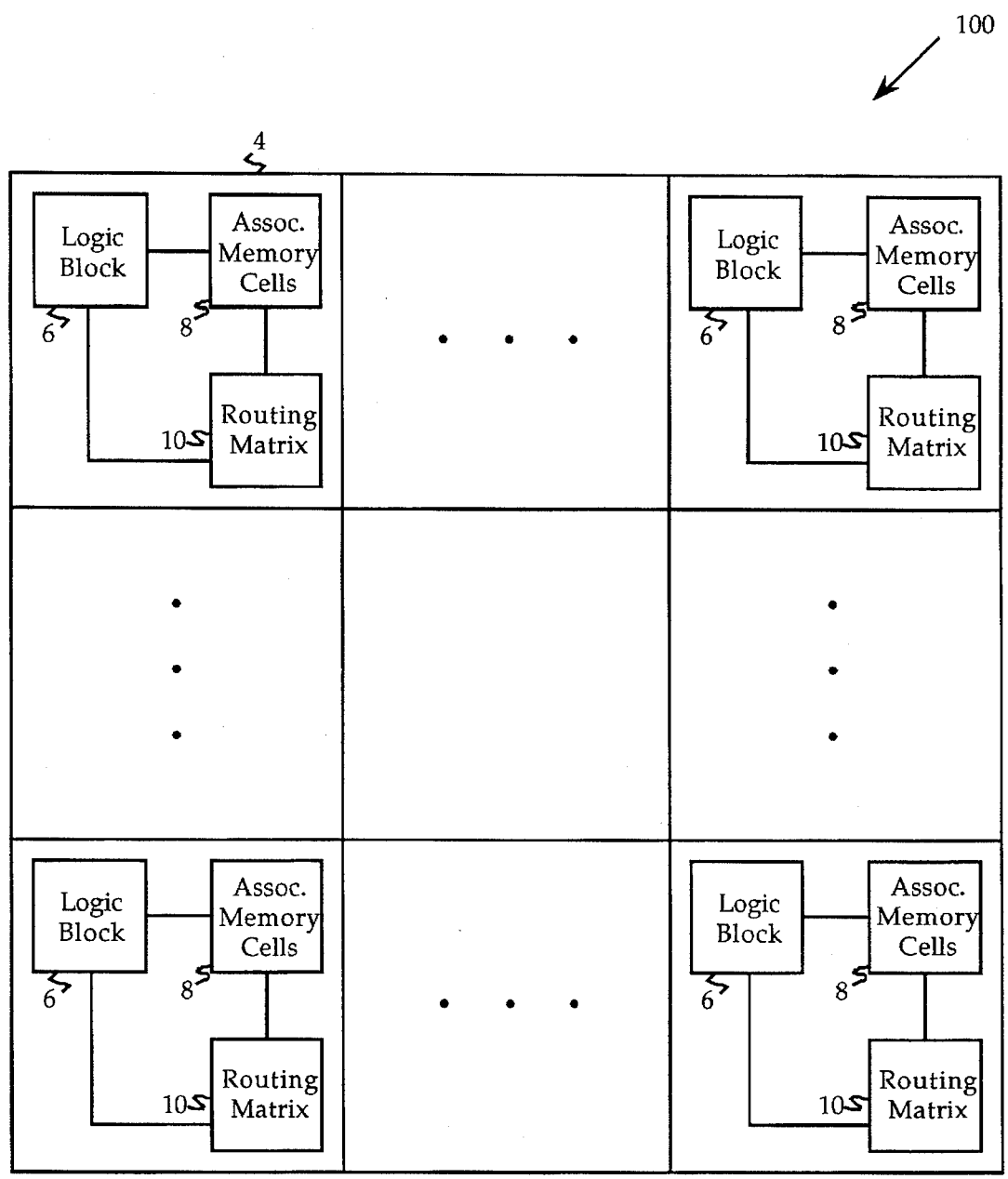
FIG. 2 is a block diagram showing one embodiment of a field programmable gate array with which the present invention could be utilized.

FIG. 2 shows a block diagram of an embodiment of an FPGA 100 with which the invention may be used. FPGA 100 comprises a plurality of gate array cells 4. Each gate array cell 4 in turn comprises a logic block 6, a routing matrix 10 and associated memory cell group 8. Logic block 6 is preferably a logic block that can be configured to perform one of a variety of logical functions. For example, logic block 6 may be configured to be a wide AND gate decoder, a multi-bit adder, a multi-input combinational function generator, or any of several million devices. Logic block 6 is configured by storing data in the associated memory cell group 8 for logic block 6. Transistor gates in logic block 6 are coupled to associated memory cell group 8 for control by configuration data that specifies the function logic block 6 is to perform. Routing matrix 10 is used to couple the inputs and outputs of logic block 6 with the inputs and outputs of other logic blocks 6 for creating complex circuits on FPGA 100. Routing matrix 10 is also coupled to associated memory cell group 8 and is controlled by configuration data that are applied to the inputs of routing matrix 10 so that the inputs and outputs of logic block 6 are coupled as desired.

In one embodiment of FPGA 100, logic block 6, routing matrix 10, and associated memory cell group 8 of each gate array cell 4 are grouped together physically near each other across FPGA 100. This is advantageous because it reduces the amount of wiring needed. Components 6, 8, and 10 may, however, be separated from each other or arranged in other configurations without departing from the spirit of the present invention. In any case, where FPGAs are to be incorporated in the present invention, the electrical correspondence among components 6, 8, and 10 is maintained.

Actual FPGAs can be very large, comprising hundreds of gate array cells. An exemplary FPGA has an array of 20 by 20 gate array cells, each gate array cell having an associated group of about 408 memory cells. Thus, there are 163,200 memory cells in the array of memory cells for this FPGA. Loading Configuration Memory Referring now to FIG. 3, a block diagram of a preferred embodiment of the present invention is shown. Control unit 20 generates a plurality of signals to control the configuration process of four-FPGA array 22. The array could comprise any number of FPGAs. The signals generated by control unit 20 include: a load signal (LOAD) fed via line 40 to FPGA 102 at load control input terminal 28, and a common enable/disable signal ($\overline{EN/DL}$) line 42 also connected via AND gates 32, 33, 35, and 37 to each of the FPGAs in array 22. In the embodiment of FIG. 3, control unit 20 also generates a clock signal (CLK) fed to the clock input terminals 26 of each FPGA via clock line 48, and fed to the clock input terminal of configuration data storage unit 30, though in another embodiment, the clock signal may be generated elsewhere. If desired, signal LOAD could be tied to a high voltage source Vcc (not shown) to enable first FPGA 102 soon after power-up of the array. Signal $\overline{EN/DL}$ remains high until configuration is complete or until a break in the configuration data loading process is required.

Configuration data storage unit 30 preferably comprises a microprocessor, a magnetic storage unit, an EEPROM array, a flash memory, or any other stable, quickly accessible memory device or combination of devices known to those skilled in the art of data access and storage. In a preferred embodiment of the present invention, common data bus 50 transfers a concatenated stream of data from configuration data storage unit 30 to FPGAs 102–108 in parallel format via data bus tie-ins 52. A serial bitstream would, however, be acceptable for the purposes of the present invention.

A key feature of the present invention, apparent in FIG. 3, is the daisy-chain layout of the FPGA array. While first FPGA 102, including AND gate 32 and buffer 34, receives signal LOAD from control unit 20 via line 40, all other FPGAs in the array receive an enabling signal at Load control input terminal 28 from the preceding FPGA in the array. For example, second FPGA 104 receives a signal to begin configuring from FPGA 102. Only enable signals pass across the daisy-chain connections. All data flows through data bus 50 directly to each FPGA. In this manner, data flow to each destination device is accelerated, since the data need not flow through devices positioned higher-up in the array. Moreover, since enable signals flow from one device to the next, no chip select signal is required from the control unit to each device. A further advantage of avoiding data transfer between devices is the avoidance of multi-bit, multi-pin transfer channels which constrain valuable pin resources on the FPGA.

In an example of operation, configuration data begins to flow after power-up from configuration data storage unit 30 to data bus 50. Signals LOAD and $\overline{EN/DL}$ are set to a high voltage level. AND gate 32 on FPGA 102 receives high signals at both inputs and forwards an enabling high signal to load control input terminal 9.8. FPGA 102 is thereby enabled and receives data across data bus tie-in 59. Configuration data is loaded into FPGA 102 at a rate of one byte (normally eight or sixteen bits) per clock cycle determined by means of signal CLK. Received configuration data is then implemented within FPGA 102 in a manner known to those skilled in the art of configuring FPGAs. The data may be serialized upon input and then forwarded within the FPGA, or may be fed in parallel form, at one byte per clock cycle, for example, depending on the loading characteristics of the particular FPGA device.

When first FPGA 102 is fully configured, an enabling token is forwarded from output 29 across exchange line 46 and buffer 34 to FPGA 104 at an input to second AND gate 33. Output 29 sends a high signal to AND gate 33 which, in turn, forwards an enabling high signal to load control input terminal 28. Now, second FPGA 104 is enabled and begins to receive data via data bus 50. When FPGA 104 is fully configured, a token exchange occurs between FPGA 104 and FPGA 106. The process repeats with FPGA 108.

Upon full configuration of end FPGA 108 in array 22, an initializing (DONE) signal is sent to all FPGAs in the array to initiate data processing or any other task for which the array is designed. The DONE signal is received at activating input 27, shown in FIG. 3.

FIG. 4 is a diagram of a circuit internal to the FPGA logic which provides a wired AND function on bus 70. As shown in FIG. 4, activating input 27 connects to a pull-down transistor 31 in each FPGA. A low output signal OUT generated by the FPGA can pull down line 27. When configuration is complete, if no other conditions exist within the FPGA to prevent normal operation, signal OUT goes high, which turns off transistor 31 in that FPGA. When all FPGAs have been configured and are otherwise ready for normal operation, all OUT signals go high, turning off all transistors 31. Thus pullup resistor 33 (FIG. 3) pulls up terminals 27, providing a high input signal IN (FIG. 4) to each FPGA to thus commence operation. In another embodiment, terminal 27 is input only and the DONE signal is taken from buffer 34 of FPGA 108 and applied to the input terminal 27 of each FPGA to commence operation. Many other variations are also possible for indicating that loading is complete.

While the preferred embodiment shown in FIG. 3 includes a number of buffers and other simple logic gates, the circuit could be simplified without losing the key inventive features of the present invention. For instance, the AND gates and line 42 could be discarded without losing the token exchange feature between devices. Similarly, signal LOAD across line 40 could be replaced with a direct tie to a high voltage source, thereby enabling first FPGA 102 for immediate loading upon commencement of data flow through data bus 50. Also, end FPGA 108 need not initialize the other devices upon full configuration, that is the completely configured devices can begin operation while later devices are still being configured to take full advantage of the accelerated configuration speed of the present invention.

Data Stream Control Characteristics

Another important feature of the preferred embodiment of the present invention is the minimization of delay in enabling or disabling any particular device within the array during a configuration or data loading operation.

For example, there may be a need to suspend the loading process while a computer's central processing unit (CPU) or other control device similar to control unit 20 of FIG. 3 attends to other tasks. Using the prior art cascading structure and method, resumption of data loading will be delayed by the need to run any control signals or new data through all devices appearing before the target device in the device chain. In contrast, the method and structure of the present invention provide direct access to disable or enable any device in an array of devices.

Referring again to the circuit of FIG. 3, loading of FPGA 104 can be suspended via a low signal from EN/DL received at AND gate 33. However, because an enabling token from FPGA 102 remains at the other input to the AND gate, when EN/DL returns to logic high, loading of FPGA 104 will resume. No daisy-chain delay is incurred.

Common data bitstreams usually are preceded by preamble data. Preamble data can include data-length information, control signals or any other instruction or trigger data desired by the user. Preamble data sent to FPGAs 102 through 108 of FIG. 3 might include notification data sent to ready each FPGA's command register to receive a short command. In one manner of operation, the received command could be to send an enable token to the next device, thereby enabling direct data flow to a second device without configuring or otherwise loading data onto the first device in the array.

Thus, the method and structure of the present invention makes the time required for suspension and resumption of configuration or loading of any particular device independent of the number of devices in the plurality.

While the present invention has been described with reference to certain preferred embodiments, those skilled in the art will recognize that various modifications may be provided. For example, any number of integrated circuit devices greater than one may be used. Additionally, the invention is fully applicable to other embodiments for data-storing devices where the devices are loaded with a series bitstream instead of with parallel data blocks. These and other variations upon and modifications to the embodiment described herein are provided for by the present invention which is limited only by the following claims.

What is claimed is:

1. A method of loading data into a plurality of logic devices arranged in a circuit including a data bus, comprising the steps of:

connecting each of said plurality of logic devices to the data bus, enabling a first one of said plurality of logic devices to receive data from the data bus, loading data into said first one of said logic devices from the data bus until said first one of said logic devices reaches a loading-complete state, enabling, across a first enable signal line, a second one of said plurality of logic devices, in response to said first one of said logic devices reaching said loading-complete state, loading data into said second one of said logic devices from the data bus.

2. The method of claim 1, wherein said logic devices comprise programmable logic array devices.

3. The method of claim 1, wherein said step of connecting each of said plurality of logic devices to the data bus comprises connecting a plurality of lines from each of said logic devices to said data bus to thereby load each of said devices through a parallel data stream.

4. The method of claim 1, wherein said step of connecting each of said plurality of logic devices to the data bus comprises connecting one line from each of said logic devices to said data bus to thereby load each of said devices through a serial data stream.

5. The method of claim 2, wherein said data comprises configuration data.

6. The method of claim 1, wherein said logic devices comprise data storage arrays.

7. The method of claim 1, further comprising the step of connecting each of said plurality of logic devices to a common parallel enable line.

8. The method of claim 1, further comprising the step of connecting said data bus to a data storage unit and loading data stored in said storage unit into said logic devices.

9. The method of claim 1, further comprising the step of initiating data processing after a last one of said logic devices reaches a loading-complete state.

10. An apparatus for loading data into a plurality of logic devices comprising:

a data bus, means for connecting each of said plurality of logic devices to the data bus, means for enabling a first one of said plurality of logic devices to receive data from the data bus, means for loading data into said first one of said logic devices from the data bus until said first one of said logic devices reaches a loading-complete state, a first enable signal line for connecting a second one of said plurality of logic devices to said first one of said logic devices, and means for loading data into said second one of said logic devices from the data bus.

11. The apparatus of claim 10, wherein said logic devices comprise field programmable gate array devices.

12. The apparatus of claim 11, wherein said data comprises configuration data.

13. The apparatus of claim 10, wherein said logic devices comprise data storage arrays.

14. The apparatus of claim 10, further comprising means for connecting each of said plurality of logic devices to a common enable line.

15. The apparatus of claim 10, further comprising means for connecting said data bus to a data storage unit and means for loading data stored in said storage unit into said logic devices.

16. The apparatus of claim 10, further comprising means for initiating data processing after a last one of said logic devices reaches a loading-complete state.

17. A circuit for enabling and loading a plurality of field-programmable gate arrays (FPGAs), wherein each FPGA has an enabling input and a loading-complete-indicating output, comprising:

a data source, connected to each of said FPGAs;

means for enabling a first FPGA;

a serial connect line between said first FPGA and a second FPGA, wherein one end of said connect line is connected to the loading-complete-indicating output of said first FPGA and the other end of said connect line is connected to the enabling input of said second FPGA.

18. The circuit of claim 17, wherein said data source is connected to each of said FPGAs in parallel.

19. The circuit of claim 17, wherein said data source is connected to each of said FPGAs through a single line.

20. The circuit of claim 17, wherein said data source provides configuration data.

21. The circuit of claim 17, further comprising means for connecting each of said plurality of FPGAs to a common enable line.

22. The circuit of claim 17, further comprising means for initiating data processing after a last one of said FPGAs reaches a loading-complete state.

23. A method of loading data into a plurality of logic devices arranged in a circuit including a data bus, comprising the steps of:

connecting a plurality of lines in each of said plurality of logic devices to the data bus, enabling a first one of said plurality of logic devices to receive data from the data bus, loading data into said first one of said logic devices from the data bus in parallel across said plurality of lines until said first one of said logic devices reaches a loading-complete state, enabling, across a first enable signal line, a second one of said plurality of logic devices, in response to said first one of said logic devices reaching said loading-complete state, loading data into said second one of said logic devices from the data bus in parallel across said plurality of lines.

24. The method of claim 23, wherein said logic devices comprise programmable logic array devices.

25. The method of claim 24, wherein said data comprises configuration data.

26. The method of claim 23, wherein said logic devices comprise data storage arrays.

27. The method of claim 23, further comprising the step of connecting each of said plurality of logic devices to a common parallel enable line.

28. The method of claim 23, further comprising the step of connecting said data bus to a data storage unit and loading data stored in said storage unit into said logic devices.

29. The method of claim 23, further comprising the step of initiating data processing after a last one of said logic devices reaches a loading-complete state.

30. An apparatus for loading data into a plurality of logic devices comprising:

a data bus, means for connecting each of said plurality of logic devices to the data bus across a plurality of lines, means for enabling a first one of said plurality of logic devices to receive data from the data bus, means for loading data into said first one of said logic devices from the data bus in parallel across said plurality of lines until said first one of said logic devices reaches a loading-complete state, a first enable signal line for connecting a second one of said plurality of logic devices to said first one of said logic devices, and means for loading data into said second one of said logic devices from the data bus in parallel across said plurality of lines.

31. The apparatus of claim 30, wherein said logic devices comprise field programmable gate array devices.

32. The apparatus of claim 31, wherein said data comprises configuration data.

33. The apparatus of claim 30, wherein said logic devices comprise data storage arrays.

34. The apparatus of claim 30, further comprising means for connecting each of said plurality of logic devices to a common enable line.

35. The apparatus of claim 30, further comprising means for connecting said data bus to a data storage unit and means for loading data stored in said storage unit into said logic devices.

36. The apparatus of claim 30, further comprising means for initiating data processing after a last one of said logic devices reaches a loading-complete state.

37. A method of loading data into a plurality of logic devices arranged in a circuit including a data bus, comprising the steps of:

connecting each of said plurality of logic devices to the data bus, enabling a first one of said plurality of logic devices to receive data from the data bus, loading data into said first one of said logic devices from the data bus in either of a parallel and a serial fashion until said first one of said logic devices reaches a loading-complete state, enabling, across a first enable signal line, a second one of said plurality of logic devices, in response to said first one of said logic devices reaching said loading-complete state, loading data into said second one of said logic devices from the data bus in said either of said parallel and serial fashion.

38. The method of claim 37, wherein said logic devices comprise programmable logic array devices.

39. The method of claim 37, wherein said step of connecting each of said plurality of logic devices to the data bus comprises connecting a plurality of lines from each of said logic devices to said data bus to thereby load each of said devices through a parallel data stream.

40. The method of claim 37, wherein said step of connecting each of said plurality of logic devices to the data bus comprises connecting one line from each of said logic devices to said data bus to thereby load each of said devices through a serial data stream.

41. The method of claim 38, wherein said data comprises configuration data.

42. The method of claim 37, wherein said logic devices comprise data storage arrays.

43. The method of claim 37, further comprising the step of connecting each of said plurality of logic devices to a common parallel enable line.

44. The method of claim 37, further comprising the step of connecting said data bus to a data storage unit and loading data stored in said storage unit into said logic devices.

45. The method of claim 37, further comprising the step of initiating data processing after a last one of said logic devices reaches a loading-complete state.

46. An apparatus for loading data into a plurality of logic devices comprising:

a data bus, means for connecting each of said plurality of logic devices to the data bus, means for enabling a first one of said plurality of logic devices to receive data from the data bus, means for loading data into said first one of said logic devices from the data bus in either of a parallel and serial fashion until said first one of said logic devices reaches a loading-complete state, a first enable signal line for connecting a second one of said plurality of logic devices to said first one of said logic devices, and means for loading data into said second one of said logic devices from the data bus in said either of said parallel and said serial fashion.

47. The apparatus of claim 46, wherein said logic devices comprise field programmable gate array devices.

48. The apparatus of claim 47, wherein said data comprises configuration data.

49. The apparatus of claim 46, wherein said logic devices comprise data storage arrays.

50. The apparatus of claim 46, further comprising means for connecting each of said plurality of logic devices to a common enable line.

51. The apparatus of claim 46, further comprising means for connecting said data bus to a data storage unit and means for loading data stored in said storage unit into said logic devices.

52. The apparatus of claim 46, further comprising means for initiating data processing after a last one of said logic devices reaches a loading-complete state.

* * * * *

UNITED STATES PATENT AND TRADEMARK OFFICE
CERTIFICATE OF CORRECTION

PATENT NO. : 5,640,106
DATED : June 17, 1997
INVENTOR(S) : Charles R. Erickson
Lawrence Cy-Wei Hung It is certified that error appears in the above-identified patent and that said Letters Patent is hereby corrected as shown below:

On the title page under item [56] "References Cited" insert
--Application Note 38, "Configuring Multiple FLEX 8000 Devices,"
May 1994, version 2, available from Altera Corporation,
pp. 71-90.--.

On the front page under line [56] "References Cited," delete
"Arawal" and insert --Agrawal--.

Col. 1, line 42, after "blocks" insert --16.--.

Col. 4, line 50, delete "9.8" and insert --28--.

Col. 4, line 51, delete "59" and insert --52--.

Signed and Sealed this

Second Day of December, 1997

Attest:

BRUCE LEHMAN

Attesting Officer

Commissioner of Patents and Trademarks